(12) United States Patent
Yang et al.

(10) Patent No.: US 9,175,382 B2
(45) Date of Patent: Nov. 3, 2015

(54) HIGH METAL IONIZATION SPUTTER GUN

(75) Inventors: Hong Sheng Yang, Pleasanton, CA (US); Tony P. Chiang, Campbell, CA (US); Kent Riley Child, Dublin, CA (US); Chi-I Lang, Cupertino, CA (US); ShouQian Shao, Fremont, CA (US)

(73) Assignee: Intermolecular, Inc., San Jose, CA (US)

( * ) Notice: Subject to any disclaimer, the term of this patent is extended or adjusted under 35 U.S.C. 154(b) by 623 days.

(21) Appl. No.: 13/281,316

(22) Filed: Oct. 25, 2011

(65) Prior Publication Data

US 2013/0101750 A1    Apr. 25, 2013

(51) Int. Cl.
   *C23C 14/34* (2006.01)
   *H01J 37/34* (2006.01)
   *C23C 14/35* (2006.01)

(52) U.S. Cl.
   CPC ............ *C23C 14/345* (2013.01); *C23C 14/3485* (2013.01); *C23C 14/352* (2013.01); *H01J 37/3402* (2013.01); *H01J 37/3405* (2013.01); *H01J 37/3458* (2013.01); *H01J 37/3467* (2013.01)

(58) Field of Classification Search
   CPC ...... C23C 14/345; C23C 14/34; C23C 14/35; C23C 14/352; C23C 14/3485; H01J 37/3467; H01J 37/345; H01J 37/3452; H01J 37/3458; H01J 37/3405; H01J 37/3402

USPC ............... 204/192.1, 192.12, 192.15, 192.24, 204/298.01–298.09, 298.11–298.41; 427/457, 569, 570, 571

See application file for complete search history.

(56) References Cited

U.S. PATENT DOCUMENTS

| | | | |
|---|---|---|---|
| 6,471,830 B1 * | 10/2002 | Moslehi et al. | 204/192.12 |
| 7,750,575 B2 | 7/2010 | Chistyakov | |
| 2005/0255691 A1 * | 11/2005 | Ding et al. | 438/627 |
| 2007/0095651 A1 * | 5/2007 | Ye et al. | 204/192.1 |
| 2009/0065350 A1 | 3/2009 | Anders | |
| 2010/0326815 A1 | 12/2010 | Chistyakov | |

* cited by examiner

Primary Examiner — Dah-Wei D Yuan
Assistant Examiner — Nga Leung V Law

(57) ABSTRACT

In one aspect of the invention, a process chamber is provided. The chamber includes a plurality of sputter guns with a target affixed to one end of each of the sputter guns. Each of the plurality of sputter guns is coupled to a first power source. The first power source is operable to provide a pulsed power supply to each of the plurality of sputter guns. The pulsed power supply has a duty cycle that is less than 30%. A substrate support disposed at a distance from the plurality of sputter guns is included. The substrate support is coupled to a second power source. The second power source is operable to bias a substrate disposed on the substrate support, wherein the duty cycle of the second power source is synchronized with a duty cycle of the first power source. A method of performing a deposition process is also included.

12 Claims, 7 Drawing Sheets ced rowseven for wafers as large as 300 mm. Alternatively,

HIGH METAL IONIZATION SPUTTER GUN

TECHNICAL FIELD

The present disclosure generally relates to the field of thin film deposition apparatus and methods and more particularly to sputter deposition apparatus and methods.

BACKGROUND

Physical vapor deposition is commonly used within the semiconductor industry, as well as within solar, glass coating, and other industries, in order to deposit a layer over a substrate. Sputtering is a common physical vapor deposition method, where atoms or molecules are ejected from a target material by high-energy particle bombardment and then deposited onto the substrate.

In order to identify different materials, evaluate different unit process conditions or parameters, or evaluate different sequencing and integration of processes, and combinations thereof, it may be desirable to be able to process different regions of the substrate differently. This capability, hereinafter called "combinatorial processing", is generally not available with tools that are designed specifically for conventional full substrate processing. Furthermore, it may be desirable to subject localized regions of the substrate to different processing conditions (e.g., localized deposition) in one step of a sequence followed by subjecting the full substrate to a similar processing condition (e.g., full substrate deposition) in another step.

Current full-substrate PVD tools used in semiconductor industry utilize a large sputter gun and large target, i.e., the target is larger than a wafer for uniform film deposition on the wafer, even for wafers as large as 300 mm. Alternatively, some full wafer PVD tools use a smaller sputter gun, e.g., 3" or 4" diameter, with a rotating wafer, where the wafer may be 200 mm diameter or smaller and the sputter gun is pointed to the mid-radius of the wafer and the target-to-wafer spacing is relatively large, e.g., 200 mm. Combinatorial processing chambers typically include smaller sputter guns. In order to achieve high metal ionization to improve step coverage a relatively high power, e.g., greater than 10 kilowatts, may be needed to be applied to the sputter gun and the substrate is biased. However, this high power lasting a relatively long period of time can damage the sputter gun, especially the smaller diameter guns.

What is needed is the ability to achieve high metal ionization without damaging the sputter guns, especially the smaller diameter sputter guns. It is within this context that the current embodiments arise.

SUMMARY

Embodiments of the present invention provide a sputter processing tool that is capable of handling high power to achieve high metal ionization. Several inventive embodiments of the present invention are described below.

In one aspect of the invention, a process chamber is provided. The chamber includes a plurality of sputter guns with a target affixed to one end of each of the sputter guns. Each of the plurality of sputter guns is coupled to a first power source. The first power source is operable to provide a pulsed power supply to each of the plurality of sputter guns. The pulsed power supply has a duty cycle that is less than 30%. A substrate support disposed at a distance from the plurality of sputter guns is included. The substrate support is coupled to a second power source. The second power source is operable to bias a substrate disposed on the substrate support, wherein the duty cycle of the first power source is synchronized with a duty cycle of the second power source.

In another aspect of the invention a method of processing a substrate is provided. The method initiates with applying pulsed power from a first power source to a plurality of sputter guns wherein the duty cycle is less than or equal to 30%. The method includes applying pulsed power from a second power source to a substrate support operable to support the substrate and bias it with a negative voltage. The method further includes synchronizing a duty cycle of the pulsed power from the first power source with a duty cycle of the pulsed power from the second power source. A layer of material is deposited onto the substrate in the method.

Other aspects of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Like reference numerals designate like structural elements.

DETAILED DESCRIPTION

Figure 1:
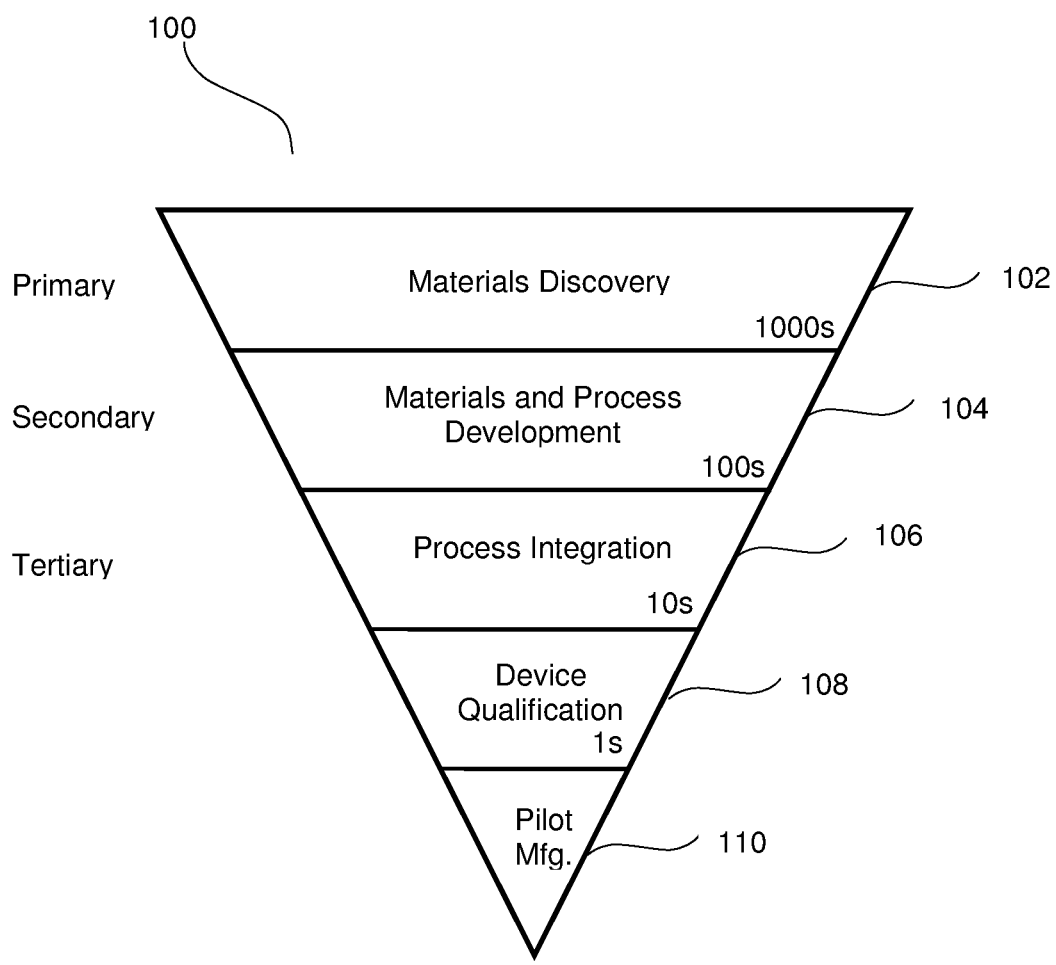
FIG. 1 illustrates a schematic diagram for implementing combinatorial processing and evaluation using primary, secondary, and tertiary screening.

The embodiments described herein provide a method and apparatus related to sputter deposition processing. It will be obvious, however, to one skilled in the art, that the present invention may be practiced without some or all of these specific details. In other instances, well known process operations have not been described in detail in order not to unnecessarily obscure the present invention.

Semiconductor manufacturing typically includes a series of processing steps such as cleaning, surface preparation, deposition, patterning, etching, thermal annealing, and other related unit processing steps. The precise sequencing and integration of the unit processing steps enables the formation of functional devices meeting desired performance metrics such as efficiency, power production, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been successfully adapted to wet chemical processing such as etching and cleaning. HPC processing techniques have also been successfully adapted to deposition processes such as physical vapor deposition (PVD), atomic layer deposition (ALD), and chemical vapor deposition (CVD).

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of semiconductor manufacturing operations by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a device. A global optimum sequence order is therefore derived and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate that are equivalent to the structures formed during actual production of the semiconductor device. For example, such structures may include, but would not be limited to, contact layers, buffer layers, absorber layers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
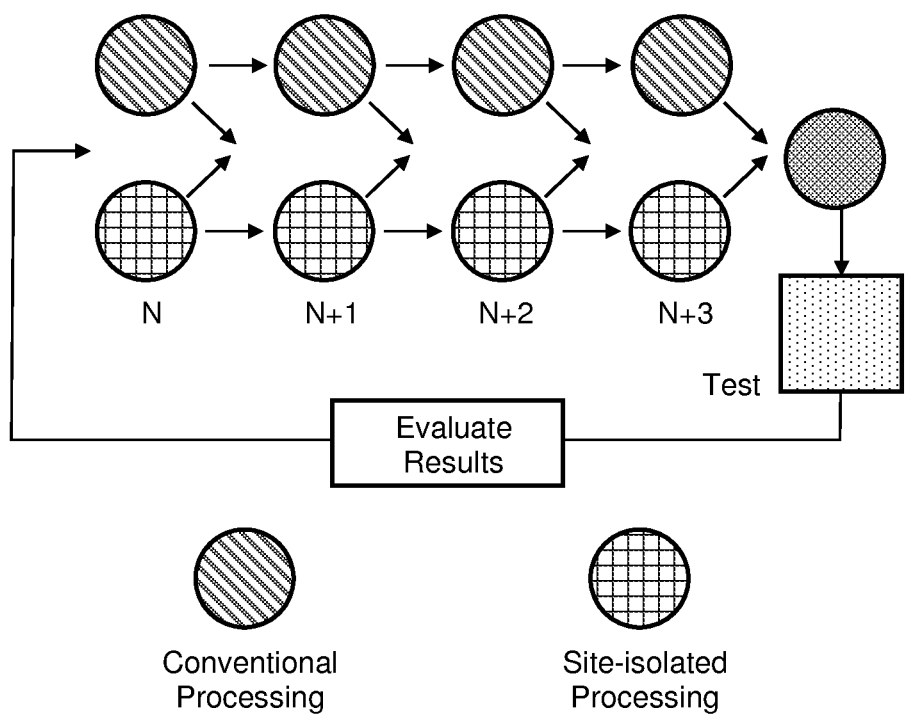
FIG. 2 is a simplified schematic diagram illustrating a general methodology for combinatorial process sequence integration that includes site isolated processing and/or conventional processing in accordance with one embodiment of the invention.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Figure 3:
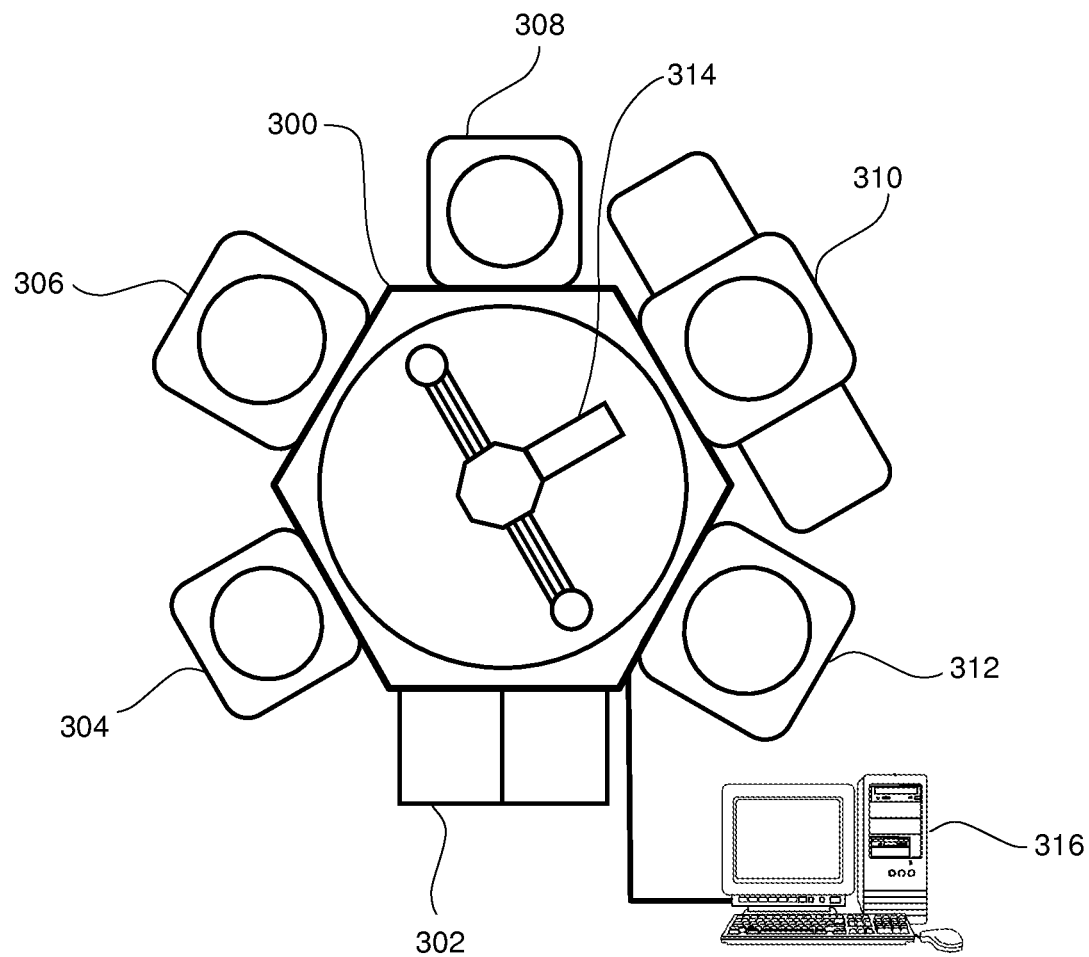
FIG. 3 is a simplified schematic diagram illustrating an integrated high productivity combinatorial (HPC) system in accordance with some embodiments of the invention.

FIG. 3 is a simplified schematic diagram illustrating an integrated high productivity combinatorial (HPC) system in accordance with some embodiments of the invention. HPC system includes a frame 300 supporting a plurality of processing modules. It should be appreciated that frame 300 may be a unitary frame in accordance with some embodiments. In some embodiments, the environment within frame 300 is controlled. Load lock/factory interface 302 provides access into the plurality of modules of the HPC system. Robot 314 provides for the movement of substrates (and masks) between the modules and for the movement into and out of the load lock 302. Modules 304-312 may be any set of modules and preferably include one or more combinatorial modules. For example, module 304 may be an orientation/degassing module, module 306 may be a clean module, either plasma or non-plasma based, modules 308 and/or 310 may be combinatorial/conventional dual purpose modules. Module 312 may provide conventional clean or degas as necessary for the experiment design.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device 316, may control the processes of the HPC system, including the power supplies and synchronization of the duty cycles described in more detail below. Further details of one possible HPC system are described in U.S. application Ser. Nos. 11/672,478 and 11/672,473. With HPC system, a plurality of methods may be employed to deposit material upon a substrate employing combinatorial processes.

Figure 4:
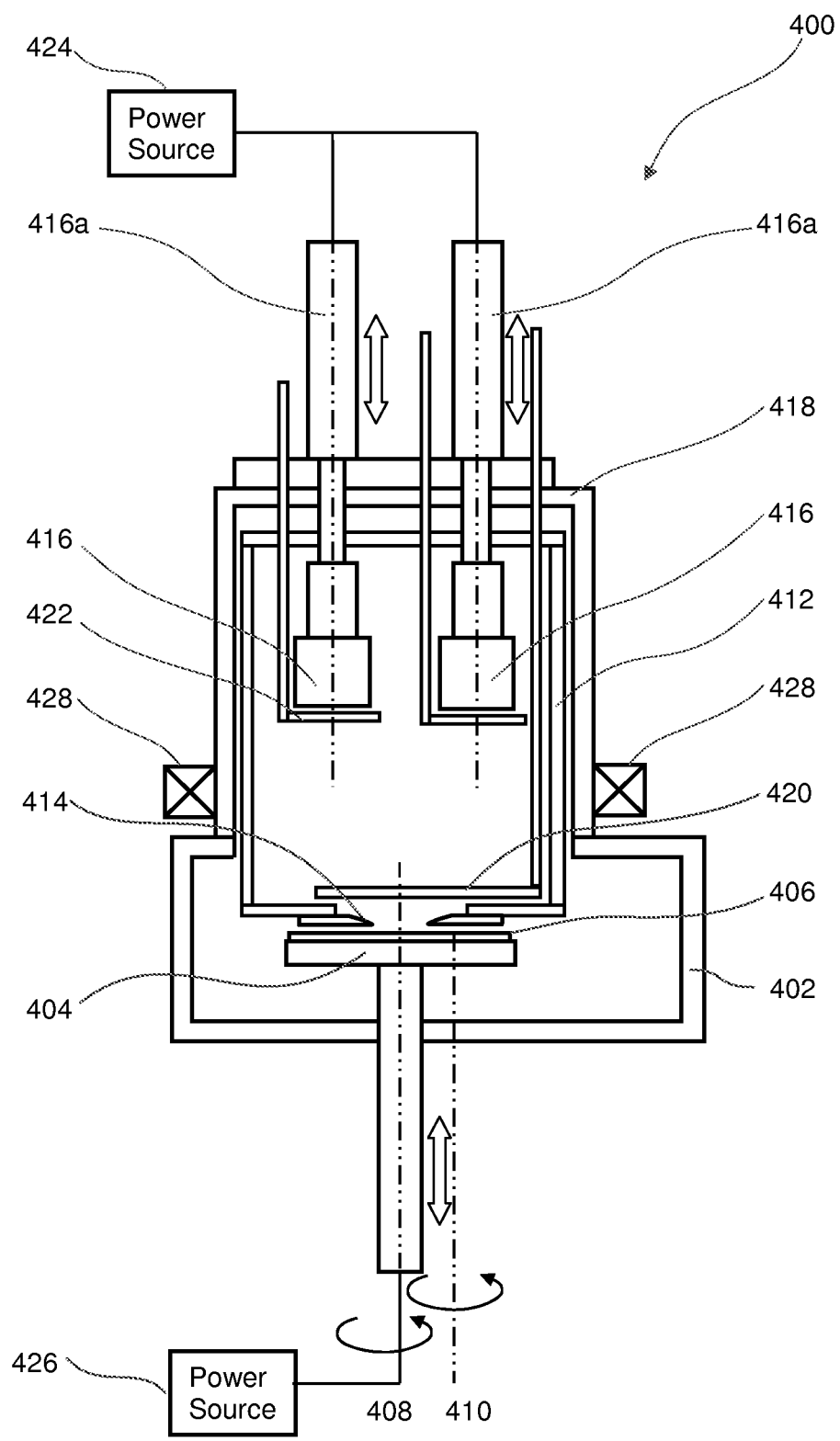
FIG. 4 is a simplified schematic diagram illustrating a sputter processing chamber configured to perform combinatorial processing and full substrate processing in accordance with some embodiments of the invention.

FIG. 4 is a simplified schematic diagram illustrating a sputter chamber configured to perform combinatorial processing and full substrate processing in accordance with some embodiments of the invention. Processing chamber 400 includes a bottom chamber portion 402 disposed under top chamber portion 418. Within bottom portion 402, substrate support 404 is configured to hold a substrate 406 disposed thereon and can be any known substrate support, including but not limited to a vacuum chuck, electrostatic chuck or other known mechanisms. Substrate support 404 is capable of both rotating around its own central axis 408 (referred to as "rotation" axis), and rotating around an exterior axis 410 (referred to as "revolution" axis). Such dual rotary substrate support is central to combinatorial processing using site-isolated mechanisms. Other substrate supports, such as an XY table, can also be used for site-isolated deposition. In addition, substrate support 404 may move in a vertical direction. It should be appreciated that the rotation and movement in the vertical direction may be achieved through known drive mechanisms which include magnetic drives, linear drives, worm screws, lead screws, a differentially pumped rotary feed through drive, etc. Power source 426 provides a bias power to substrate support 404 and substrate 406, and produces a negative bias voltage on substrate 406. In some embodiments power source 426 provides a radio frequency (RF) power sufficient to take advantage of the high metal ionization to improve step coverage of vias and trenches of patterned wafers. In another embodiment, the RF power supplied by power source 426 is pulsed and synchronized with the pulsed power from power source 424.

Substrate 406 may be a conventional round 200 mm, 300 mm, or any other larger or smaller substrate/wafer size. In other embodiments, substrate 406 may be a square, rectangular, or other shaped substrate. One skilled in the art will appreciate that substrate 406 may be a blanket substrate, a coupon (e.g., partial wafer), or even a patterned substrate having predefined regions. In another embodiment, substrate 406 may have regions defined through the processing described herein. The term region is used herein to refer to a localized area on a substrate which is, was, or is intended to be used for processing or formation of a selected material. The region can include one region and/or a series of regular or periodic regions predefined on the substrate. The region may have any convenient shape, e.g., circular, rectangular, elliptical, wedge-shaped, etc. In the semiconductor field a region may be, for example, a test structure, single die, multiple dies, portion of a die, other defined portion of substrate, or an undefined area of a substrate, e.g., blanket substrate which is defined through the processing.

Top chamber portion 418 of chamber 400 in FIG. 4 includes process kit shield 412, which defines a confinement region over a radial portion of substrate 406. Process kit shield 412 is a sleeve having a base (optionally integrated with the shield) and an optional top within chamber 400 that may be used to confine a plasma generated therein. The generated plasma will dislodge atoms from a target and the sputtered atoms will deposit on an exposed surface of substrate 406 to combinatorial process regions of the substrate in some embodiments. In another embodiment, full wafer processing can be achieved by optimizing gun tilt angle and target-to-substrate spacing, and by using multiple process guns 416. Process kit shield 412 is capable of being moved in and out of chamber 400, i.e., the process kit shield is a replaceable insert. In another embodiment, process kit shield 412 remains in the chamber for both the full substrate and combinatorial processing. Process kit shield 412 includes an optional top portion, sidewalls and a base. In some embodiments, process kit shield 412 is configured in a cylindrical shape, however, the process kit shield may be any suitable shape and is not limited to a cylindrical shape.

The base of process kit shield 412 includes an aperture 414 through which a surface of substrate 406 is exposed for deposition or some other suitable semiconductor processing operations. Aperture shutter 420 which is moveably disposed over the base of process kit shield 412. Aperture shutter 420 may slide across a bottom surface of the base of process kit shield 412 in order to cover or expose aperture 414 in some embodiments. In another embodiment, aperture shutter 420 is controlled through an arm extension which moves the aperture shutter to expose or cover aperture 414. It should be noted that although a single aperture is illustrated, multiple apertures may be included. Each aperture may be associated with a dedicated aperture shutter or an aperture shutter can be configured to cover more than one aperture simultaneously or separately. Alternatively, aperture 414 may be a larger opening and plate 420 may extend with that opening to either completely cover the aperture or place one or more fixed apertures within that opening for processing the defined regions. The dual rotary substrate support 404 is central to the site-isolated mechanism, and allows any location of the substrate or wafer to be placed under the aperture 414. Hence, the site-isolated deposition is possible at any location on the wafer/substrate.

A gun shutter, 422 may be included. Gun shutter 422 functions to seal off a deposition gun when the deposition gun may not be used for the processing in some embodiments. For example, two process guns 416 are illustrated in FIG. 4. Process guns 416 are moveable in a vertical direction so that one or both of the guns may be lifted from the slots of the shield. While two process guns are illustrated, any number of process guns may be included, e.g., one, three, four or more process guns may be included. Where more than one process gun is included, the plurality of process guns may be referred to as a cluster of process guns. Gun shutter 422 can be transitioned to isolate the lifted process guns from the processing area defined within process kit shield 412. In this manner, the process guns are isolated from certain processes when desired. It should be appreciated that slide cover plate 422 may be integrated with the top of the process kit shield 412 to cover the opening as the process gun is lifted or individual cover plate 422 can be used for each target. In some embodiments, process guns 416 are oriented or angled so that a normal reference line extending from a planar surface of the target of the process gun is directed toward an outer periphery of the substrate in order to achieve good uniformity for full substrate deposition film. The target/gun tilt angle depends on the target size, target-to-substrate spacing, target material, process power/pressure, etc.

Top chamber portion 418 of chamber 400 of FIG. 4 includes sidewalls and a top plate which house process kit shield 412. Arm extensions 416a, which are fixed to process guns 416 may be attached to a suitable drive, e.g., lead screw, worm gear, etc., configured to vertically move process guns 416 toward or away from a top plate of top chamber portion 418. Arm extensions 416a may be pivotally affixed to process guns 416 to enable the process guns to tilt relative to a vertical axis. In some embodiments, process guns 416 tilt toward aperture 414 when performing combinatorial processing and tilt toward a periphery of the substrate being processed when performing full substrate processing. It should be appreciated that process guns 416 may tilt away from aperture 414 when performing combinatorial processing in another embodiment. In yet another embodiment, arm extensions 416a are attached to a bellows that allows for the vertical movement and tilting of process guns 416. Arm extensions 416a enable movement with four degrees of freedom in some embodiments. Where process kit shield 412 is utilized, the aperture openings are configured to accommodate the tilting of the process guns. The amount of tilting of the process guns may be dependent on the process being performed in some embodiments.

Power source 424 provides power for sputter guns 416 whereas power source 426 provides RF bias power to an electrostatic chuck. As mentioned above, the output of power source 426 is synchronized with the output of power source 424. It should be appreciated that power source 424 may output a direct current (DC) power supply or a radio frequency (RF) power supply. In another embodiment the DC power is pulsed and the duty cycle is 30% on-time at maximum power in order to achieve a peak power of 10-15 kilowatts. Thus, the peak power for high metal ionization and high density plasma is achieved at a relatively low average power which will not cause any target overheating/cracking issues. It should be appreciated that the duty cycle and peak power levels are exemplary and not meant to be limiting as other ranges are possible and may be dependent on the material and/or process being performed.

Chamber 400 includes magnet 428 disposed around an external periphery of the chamber. Magnet 428 is located in a region defined between the bottom surface of sputter guns 416 and a top surface of substrate 406. Magnet 428 may be either a permanent magnet or an electromagnet. It should be appreciated that magnet 428 is utilized to improve ion guidance as the magnetic field distribution above substrate 406 is re-distributed or optimized to guide metal ions on to the substrate for improved step coverage of vias or trenches in semiconductor devices in some embodiments.

Figure 5:
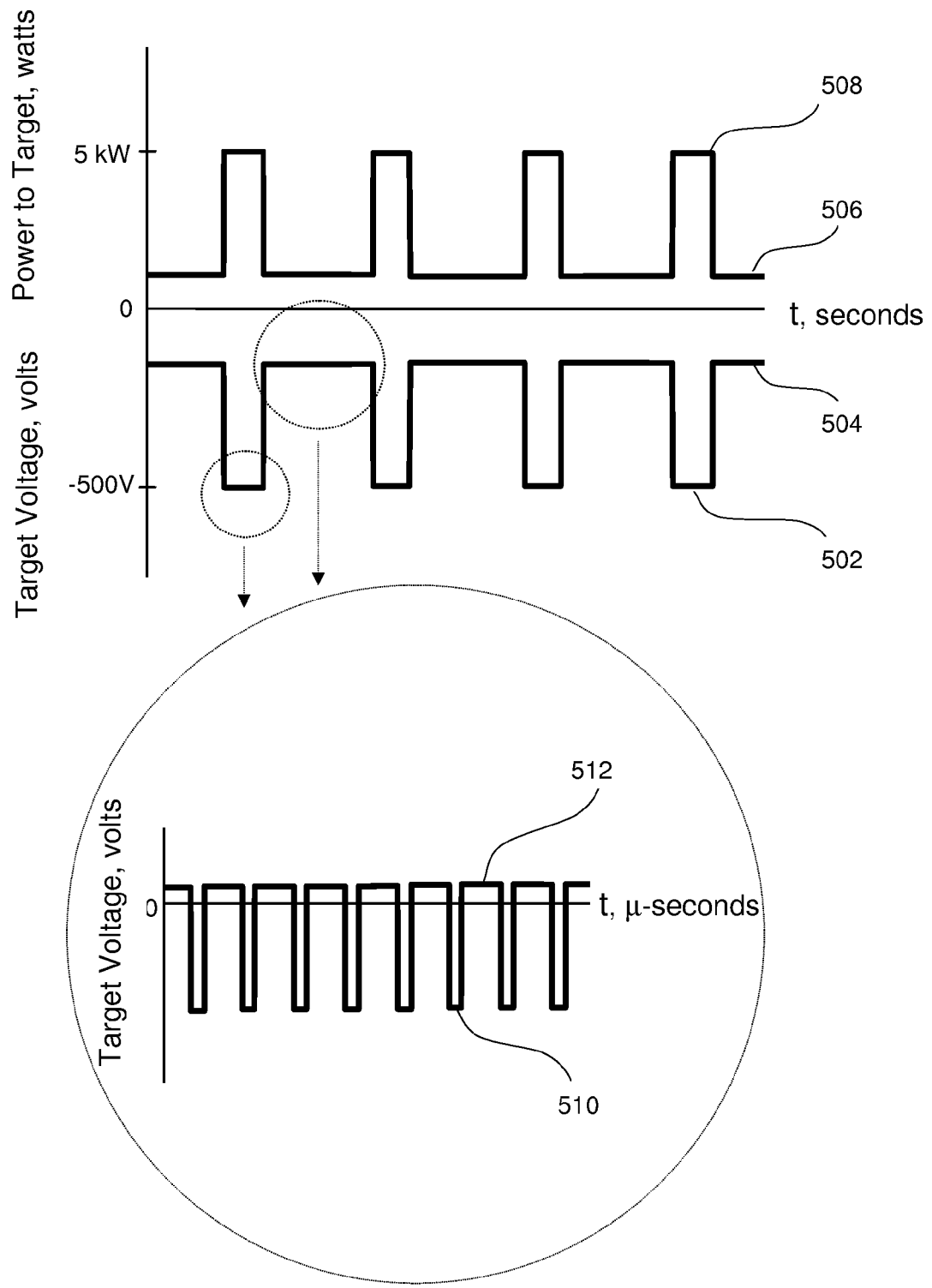
FIG. 5 is a simplified schematic diagram illustrating the duty cycle applied to the sputter guns in accordance with some embodiments of the invention.

FIG. 5 is a simplified schematic diagram illustrating the duty cycle applied to the sputter guns in accordance with some embodiments of the invention. In FIG. 5 a first waveform illustrates the power, in kilowatts (kW), supplied to a target while a second waveform illustrates the target voltage. The first waveform includes a series of pulses 508 and low-power states 506. The frequency of the pulses in the range between about 0.1 Hz and about 500 Hz. The second waveform also includes a series of pulses 502 and low-negative voltage (i.e. closer to zero voltage) states 504. The duty cycle defined by both the first and second waveform is approximately 30% or less for the on-time in some embodiments. The waveforms of FIG. 5 are provided by power source 424 of FIG. 4. It should be appreciated that while a peak power to the target of 5 kW and a peak voltage is −500 volts are illustrated, different peak power levels may be utilized along with different duty cycles having a greater or lesser on-time at the peak power. For example, in some embodiments a peak power of 15 kW may be achieved, while an average power of approximately 1 kW is experienced through the modulation of the duty cycle. For sputter deposition of conductive films, the power can be constant in both the high-power and low-power states. Included in FIG. 5, is a detail of high frequency, pulsed DC within the peak and low-power states of the second waveform for dielectric reactive sputtering of conductive target. As illustrated in the detail defined by peaks 510 and low-power states 512 where the scale for the X axis is in microseconds since the commercially available pulsed DC power supply has a frequency of typically 20-400 kHz. It is well understood that the reverse-voltage pulsing provides enabling capability to dielectric reactive sputtering due to their ability to reduce or even eliminate arcing.

Figure 6:
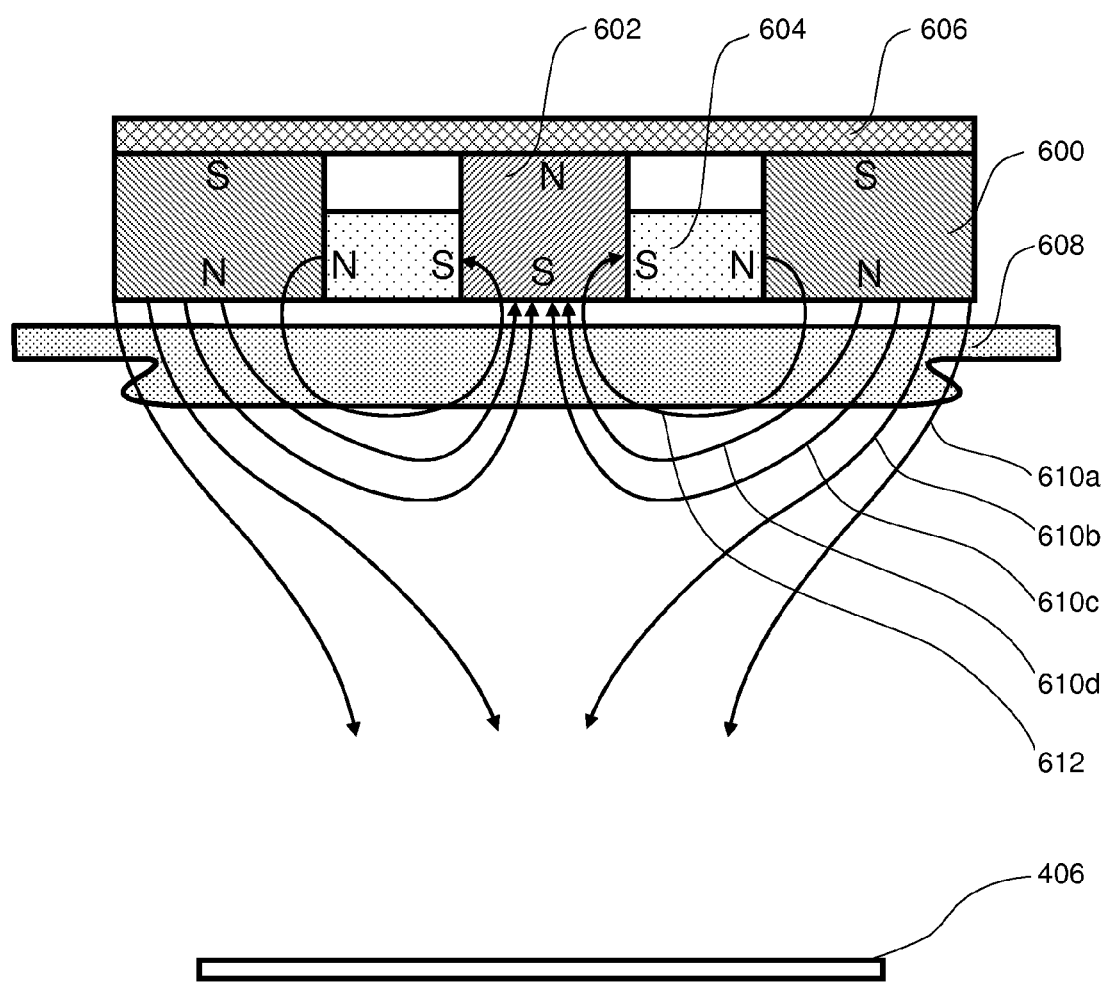
FIG. 6 is a simplified schematic diagram illustrating details of the magnetron behind a target for a sputter gun in accordance with some embodiments of the invention.

FIG. 6 is a simplified schematic diagram illustrating details of the magnetron behind a target for a sputter gun in accordance with some embodiments of the invention. Magnets 600 and 602 are affixed to plate 606. Magnets 604 are laterally disposed between magnets 600 and 602 to increase the overall magnetic field strength at sputter target surface and improve plasma stability. A preferred strengthening or weakening of one pole of the magnetron leads to "unbalanced" magnetic circuit. Such an effect can be obtained by the change of cross section surface ratio of outer and inner pole of the magnetron. The magnetic flux leaving the larger outer pole is not fully collected by the weaker inner one. Magnetic field lines and thus plasma region extend from the cathode or target 608 to the substrate 406. In such a case the density of ion current collected at negatively biased substrate can increase significantly as a result of unbalanced magnetron. The magnetic field strength unbalance ratio between the outer and inner magnets is typically 2.0 or higher for a high metal ionization sputter gun so that metal ions can be efficiently guided towards a desired deposition spot on a substrate. Flux lines 610a through 610d illustrate the focusing of the ion flux toward a center region defined below target 608. Flux line 612 shows the magnetic field line from the lateral magnet 604, being superimposed with those of the magnets 600.

Figure 7:
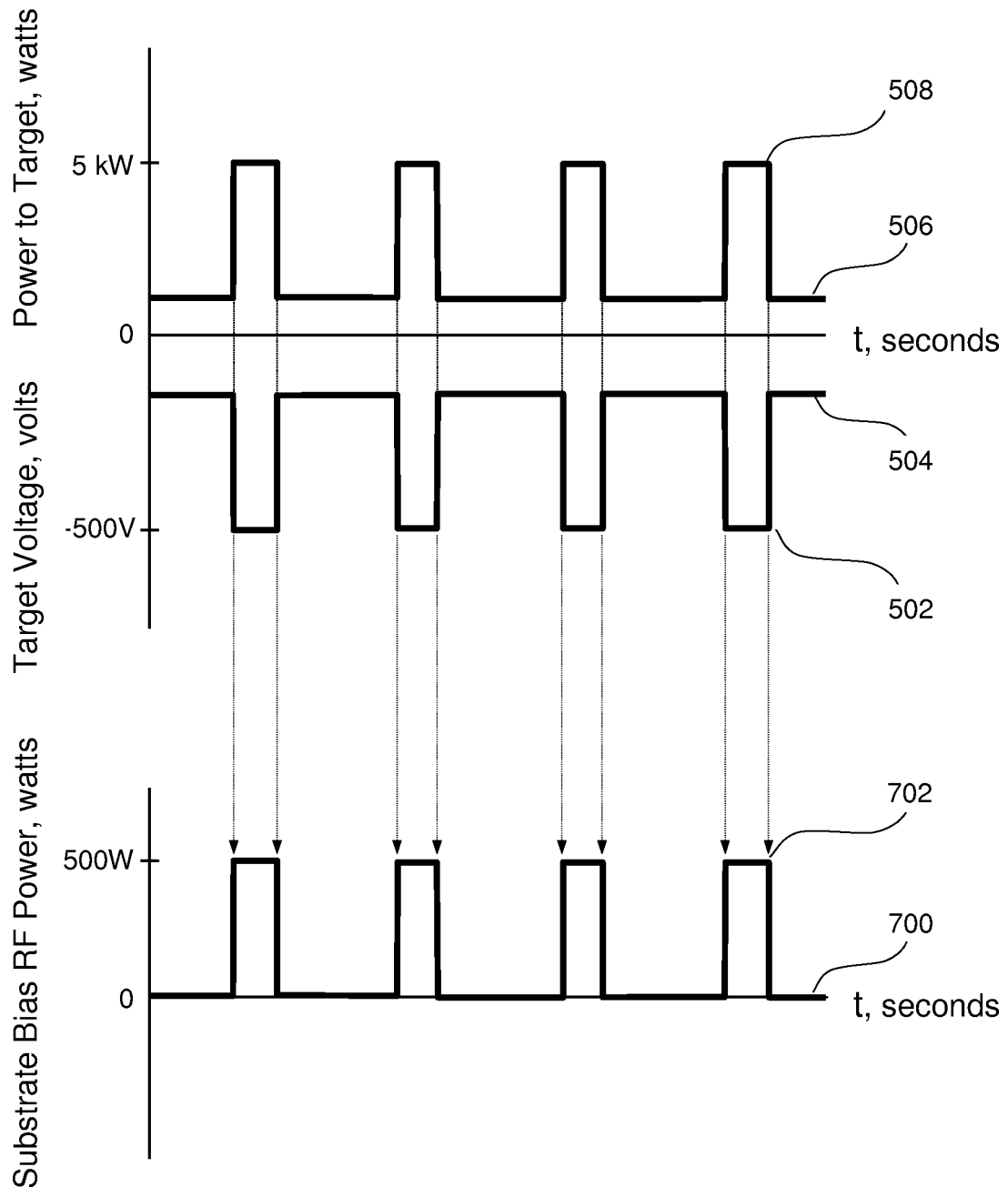
FIG. 7 is a simplified schematic diagram illustrating waveforms depicting the synchronization of the duty cycles for multiple power supplies for the processing chamber in accordance with some embodiments of the invention.

FIG. 7 is a simplified schematic diagram illustrating waveforms depicting the synchronization of the duty cycles for multiple power supplies for the processing chamber in accordance with some embodiments of the invention. The first waveform is defined by peaks 508 and low-power states 506 and the second waveform is defined by peaks 502 and low-power states 504. As these waveforms have been described with regard to FIG. 5, the details are not described here again for the sake of brevity. Illustrated below the first and second waveforms associated with the power to a target, is a third waveform defined by peaks 702 and low-power states 700. In accordance with some embodiments of the invention, the third waveform illustrates the pulsed RF power being supplied to bias a substrate on a substrate support. It should be appreciated that peaks 508, 502, and 702 are aligned or synchronized so that pulses occur concurrently for each of the waveforms. In the low-power state where metal ionization is negligible, RF bias power to the substrate can be turned off. However, it should be appreciated that, in accordance with some embodiments of the invention, the RF bias power to the substrate is kept at more or less the same level, i.e., not pulsed, throughout the low-power and high power states of the pulsed power 424 supplied to the gun, and a high bias voltage (negative value) on the substrate is expected during the low-power state of the pulsed power 424. In some embodiments, the RF power supply 426 for biasing a substrate has a frequency of 13.56 MHz.

In another embodiment of the invention, RF power is delivered to a sputter gun to achieve high metal ionization at a high process pressure of 20-40 mT. In this case, the RF power to the sputter gun and RF bias power to the substrate does not need to be pulsed.

The embodiments described herein are capable of achieving a high ionization state and are able to accommodate peak powers while experiencing a relatively low average power due to the duty cycle being set to 30% or less in some embodiments. It should be appreciated that the high metal ionization and RF-bias substrate technique described above enables improved bottom and side wall step coverage of the vias and trenches of patterned wafers. In some embodiments, sidewall coverage can be further improved by re-sputtering material from the bottom of the feature. As noted above a controller may control the timing of the pulses from each of the power sources to ensure the synchronization of the pulses.

The present invention provides greatly improved methods and apparatus for the combinatorial processing of different regions on a single substrate and processing of full substrate. It is to be understood that the above description is intended to be illustrative and not restrictive. Many embodiments and variations of the invention will become apparent to those of skill in the art upon review of this disclosure. Merely by way of example a wide variety of process times, process temperatures and other process conditions may be utilized, as well as a different ordering of certain processing steps. The scope of the invention should, therefore, be determined not with reference to the above description, but instead should be determined with reference to the appended claims along with the full scope of equivalents to which such claims are entitled.

The embodiments described above provide methods and apparatus for the parallel or rapid serial synthesis, processing and analysis of novel materials having useful properties identified for semiconductor manufacturing processes. Any materials found to possess useful properties can then subsequently be prepared on a larger scale and evaluated in actual processing conditions. These materials can be evaluated along with reaction or processing parameters through the methods described above. In turn, the feedback from the varying of the parameters provides for process optimization. Some reaction parameters which can be varied include, but are not limited to, process material amounts, reactant species, processing temperatures, processing times, processing pressures, processing gas flow rates, processing powers, processing reagent compositions, the rates at which the reactions are quenched, atmospheres in which the processes are conducted, an order in which materials are deposited, etc. In addition, the methods described above enable the processing and testing of more than one material, more than one processing condition, more than one sequence of processing conditions, more than one process sequence integration flow, and combinations thereof, on a single substrate without the need of consuming multiple substrates per material, processing condition, sequence of operations and processes or any of the combinations thereof. This greatly improves the speed as well as reduces the costs associated with the discovery and optimization of semiconductor and other manufacturing operations.

Moreover, the embodiments described herein are directed towards delivering precise amounts of material under precise processing conditions at specific locations of a substrate in order to simulate conventional manufacturing processing operations. As mentioned above, within a region the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes and process sequences may vary. It should be noted that the discrete steps of uniform processing is enabled through the HPC systems described herein.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method to deposit a material, comprising:
    applying pulsing power to a sputter gun comprising a target, wherein the pulsing power is alternated between a first low power state and a first high power state according to a first duty cycle;
    applying RF power to a substrate support positioned below the sputter gun, wherein the RF power is alternated between a second low power state and a second high power state according to a second duty cycle;
    synchronizing the first duty cycle with the second duty cycle such that the pulsing power repeatedly increases from the first low power state to the first high power state at the same time the RF power increases from the second low power state to the second high power state and the pulsing power repeatedly decreases from the first high power state to the first low power state at the same time the RF power decreases from the second high power state to the second low power state, wherein the first duty cycle and the second duty cycle are each less than 30% such that an average power delivered to the sputter gun is less than about 1 kilowatt; and
    depositing a layer above a substrate disposed on the substrate support with material ejected from the target of the sputter gun.

2. The method of claim 1, wherein the first high power state is greater than about 5 kilowatts.

3. The method of claim 1, further comprising:
    focusing an ion flux toward a center region defined below a surface of sputter gun.

4. The method of claim 3, wherein the sputter gun comprises a magnetron, wherein the magnetron comprises a first set of magnets and a second set of magnets, wherein each magnet of the first set of magnets and each magnet of the second set of magnets comprises a first pole and a second pole, each magnet of the first set of magnets is arranged such that the first pole and the second pole thereof are aligned in a direction that is perpendicular to a surface of the substrate, and each magnet of the second set of magnets is arranged such that the first pole and the second pole thereof are aligned in a direction that is parallel to the surface of the substrate.

5. The method of claim 4, wherein a magnet unbalance ratio for the magnetron is at least two.

6. The method of claim 4 wherein each magnet of the first set of magnets is positioned between and adjacent to two magnets of the second set of magnets.

7. The method of claim 1, wherein the pulsing power applied to one of the sputter guns originates from a direct current (DC) source of power.

8. A method for processing a substrate, comprising:
applying pulsed power from a first power source to a sputter gun comprising a target, wherein the pulsed power is alternated between a first low power state and a first high power state according to a first duty cycle wherein the first duty cycle is less than or equal to 30%;
applying RF power from a second power source to a substrate support operable to support the substrate and positioned below the sputter gun, wherein the RF power is alternated between a second low power state and a second high power state according to a second duty cycle;
synchronizing the first duty cycle with the second duty cycle such that the pulsed power repeatedly increases from the first low power state to the first high power state at the same time the RF power increases from the second low power state to the second high power state and the pulsing power repeatedly decreases from the first high power state to the first low power state at the same time the RF power decreases from the second high power state to the second low power state; and
depositing a layer onto a substrate disposed on the substrate support with material ejected from a target of the sputter gun.

9. The method of claim 8, wherein the pulsed power is DC power pulsed at frequencies of between about 0.1 Hz and about 500 Hz.

10. The method of claim 8, further comprising:
applying a magnetic field through a magnet located around an external surface of a chamber in which the processing occurs.

11. The method of claim 10, wherein the sputter gun comprises a magnetron, wherein the magnetron comprises a first set of magnets and a second set of magnets, wherein each magnet of the first set of magnets and each magnet of the second set of magnets comprises a first pole and a second pole, each magnet of the first set of magnets is arranged such that the first pole and the second pole thereof are aligned in a direction that is perpendicular to a surface of the substrate, and each magnet of the second set of magnets is arranged such that the first pole and the second pole thereof are aligned in a direction that is parallel to the surface of the substrate.

12. The method of claim 8,
wherein each magnet of the first set of magnets is positioned between and adjacent to two magnets of the second set of magnets.

* * * * *